Feb. 21, 1967 S. N. ZILBERFARB 3,305,170

PURE FLUID OPERATED COUNTER

Filed April 1, 1964

INVENTOR

SAUL N. ZILBERFARB

BY Griffin and Stokes

ATTORNEYS 3,305,170

PURE FLUID OPERATED COUNTER

Saul N. Zilberfarb, Philadelphia, Pa., assignor to Sperry Rand Corporation, New York, N.Y., a corporation of Delaware Filed Apr. 1, 1964, Ser. No. 356,560
8 Claims. (Cl. 235—201)

This invention relates to pure fluid operated counters. More particularly, this invention relates to N-stage counters of the type employing a single fluid amplifier in each stage.

It is well known that multistage counters may be constructed with a single fluid amplifier in each stage. However, in these counters feedback paths are provided for feeding back to the input of a given stage a predetermined portion of its input. Correct operation of these counters is dependent upon accurately controlling the magnitude of the feedback signal.

An object of this invention is to provide multistage binary counters of the type having a single fluid logic element in each stage, said stages being interconnected such that no feedback paths are required.

An object of the invention is to provide an N-stage counter having a single fluid logic element in each stage with the output of each stage conditioning the succeeding stage to respond to the pulses to be counted.

An object of this invention is to provide an N-stage counter comprising N serially connected multistable fluid amplifiers and means responsive to a fluid output signal from each amplifier for creating a power jet in the next succeeding amplifier.

A further object of this invention is to provide a series of N bistable fluid amplifiers, means connecting the output of each amplifier to the power stream input nozzle of the next amplifier, means for simultaneously applying fluid count pulses to each of said amplifiers, and means for sensing the state of said amplifiers.

Still another object of this invention is to provide a series of N bistable fluid amplifiers of the type wherein a power stream is converted to a power jet by a control signal which accelerates the power stream fluid, means connecting the output of each amplifier to the control input of the next amplifier to control the power stream velocity, and means for simultaneously applying fluid count pulses to each of said amplifiers.

Another object of the invention is to provide a novel method and means for controlling a bistable amplifier whereby it becomes possible for the power stream of the amplifier to assume a third flow condition even though the volume of power stream flow remains substantially constant. According to the present method of control a power stream is normally injected into the amplifier at a velocity less than that required for it to assume one of the two bistable conditions. The velocity of the power stream is increased during those intervals of time during which it is desired that the amplifier be in one of its stable states. Conventional control nozzles are then employed to switch the amplifier from one stable state to the other.

Still another object of this invention is to provide a bistable amplifier having an interaction chamber, first and second outputs, a power nozzle for receiving a power stream, and means for selectively varying the effective size of said nozzle to thereby vary the velocity at which the power stream is ejected from said nozzle.

A further object is to provide a conventional fluid amplifier in combination with means for varying the velocity at which the power stream is injected, said means comprising a control nozzle intersecting the power nozzle at the point where the power stream is injected whereby fluid applied to the control nozzle constrains the flow of power fluid through said power nozzle.

Other objects of the invention and its mode of operation will become apparent upon consideration of the following description and the accompanying drawing.

Figure 1:
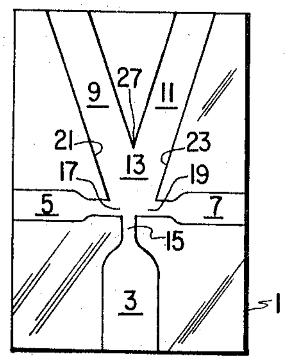
FIGURE 1 illustrates a first type of bistable fluid amplifier.

FIGURE 1 shows the channel configuration of a bistable fluid amplifier of known type. It comprises a substantially solid body 1 having formed therein a power stream input nozzle 3, first and second control input nozzles 5 and 7, and first and second output channels 9 and 11. Output channels 9 and 11 intersect at their upstream extent to form an interaction chamber 13 and nozzles 3, 5, and 7 terminate at orifices 15, 17, and 19, respectively, in the chamber so that fluid signals may be applied through the nozzles to the chamber.

Various methods for constructing fluid amplifiers are now known in the art. Various metallic, ceramic and plastic materials may be used but to better illustrate the channel and chamber configuration the body 1 is shown as being a clear plastic material.

Fluid from a power stream source (not shown) is applied to power stream nozzle 3. The nozzle 3 converges toward orifice 15 so that the power stream fluid enters chamber 13 as a high velocity jet stream. As adequately explained in the prior art the amplifier may be "geometrically biased" on any one of several ways. For example, one wall, say wall 21, may be offset from orifice 15 by a greater distance than wall 23. When geometrically biased in this manner the power jet stream at the instant it begins to flow tends to "lock on" to wall 23 and flow entirely into output channel 11.

As the high velocity power jet stream enters chamber 13 through orifice 15 it tends to entrain molecules of fluid from the two regions between the jet and the walls 21 and 23. Since the wall 23 is closer than wall 21 to the jet, the jet is more efficient in withdrawing fluid from the region adjacent this wall. This lowers the pressure in the region adjacent wall 23 to a value less than the pressure in the region between the jet and wall 21. The resulting transverse force deflects the power jet toward wall 23.

When the power jet is deflected toward wall 23 it withdraws even more molecules of fluid from the region adjacent the wall thus creating an even greater transverse force which deflects the power jet even closer to the wall. The action is cumulative and the jet attaches or "locks on" to wall 23 so that substantially all of the jet stream fluid flows into output channel 11. For purposes of the present description this condition of flow designates the "zero" or "reset" state of the amplifier.

When amplifier 1 is in the reset state its power stream may be made to detach from wall 23 and lock on to wall 21. Control nozzle 7 is provided for this purpose. A fluid control signal applied to nozzle 7 passes through orifice 19 and enters the low pressure region adjacent wall 23. The control fluid increases the pressure in this region until it is greater than the pressure in the region between wall 21 and the jet. The resulting transverse force acting against the jet bends it toward wall 21 and as a result of the cumulative action described above the power jet locks on to wall 21 and flows into output channel 9. This condition of flow is designated the "one" or "set" state of the amplifier.

Amplifier 1 may be switched from the set state to the reset state by applying a fluid control signal to nozzle 5 to thereby increase the pressure in the region adjacent wall 21 to a value greater than the pressure in the region between the jet and wall 23.

Figure 1A:
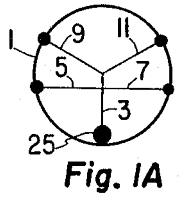
FIGURE 1A shows the logic symbol for a fluid amplifier of the type shown in FIGURE 1.

FIGURE 1A shows the symbol used in schematic diagrams to represent a bistable amplifier of the type shown in FIGURE 1. The small circle 25 at the lower extent of the power stream represents a pump, compressor or other conventional means for supplying fluid at a substantially constant rate.

Figure 1B:
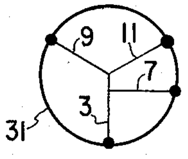
FIGURE 1B shows the logic symbol for a fluid amplifier similar to that show in FIGURE 1 but having only one control nozzle.

Amplifier 1 may also be switching from the set state to the reset state by merely terminating and then iniating the power stream flow. Therefore, in some applications the power stream nozzle 3 is connected to a source of intermittently occurring fluid signals rather than a source supplying a continuous signal. Also, the control nozzle 5 is not needed and may be eliminated. In FIGURE 1B the numeral 31 designates the symbol used in schematic diagrams to represent a bistable fluid amplifier having a pulsed power stream input and no control nozzle 5.

Figure 2A:
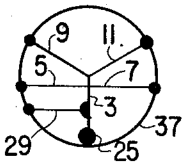
FIGURE 2A shows the logic symbol for a fluid amplifier of the type shown in FIGURE 2.
Figure 2:
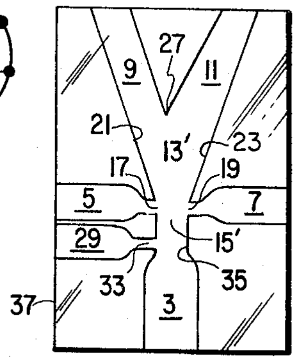
FIGURE 2 illustrates a fluid amplifier of the type having a control input varying the velocity of the power stream fluid.

FIGURE 2 shows a novel multistable amplifier 37 admirably suited for use in counters of the type wherein the output of each counter stage controls the application of a power jet to the next stage. Amplifier 37 is similar to amplifier 1 in that it has a power stream input nozzle 3; first and second control nozzles 5 and 7; and first and second output channels 9 and 11. Power stream nozzle 3 is connected to a conventional pump, compressor or other means for supplying fluid at a substantially constant rate.

Amplifier 37 differs from amplifier 1 in that the volume of fluid supplied to nozzle 3 and the cross-sectional areas of nozzle 3 and orifice 15' are chosen such that the fluid supplied to nozzle 3 does not normally enter chamber 13' as a high velocity jet stream. That is, these parameters are chosen such that the fluid stream enters chamber 13' at less than a predetermined velocity. This predetermined velocity is the minimum velocity at which the power stream can entrain sufficient molecules of fluid from the regions adjacent walls 21 and 23 to cause the stream to lock on to one of these walls. As with fluid amplifiers of the prior art, this velocity is dependent upon other parameters of the amplifier such as chamber configuration, nozzle and channel sizes, the type of fluid employed, and so forth. Furthermore, divider element 27 is offset to the left of the center line of orifice 15' so that in the absence of any control signals the slowly moving power stream strikes divider element 27 and flows primarily into output channel 11.

Amplifier 37 is provided with a control nozzle 29 for the purpose of controlling the velocity of the power stream fluid. When a fluid signal of sufficient magnitude is applied to nozzle 29 it causes a high velocity fluid jet to issue from orifice 33. This jet effectively reduces the cross-sectional area of orifice 15' by compressing the power stream fluid between the control jet and wall 35. The artificial restrictive orifice thus formed is bounded on one side by wall 35, bounded on the opposing side by the control jet from orifice 33, and bounded on the top and bottom by the cover plates of the amplifier. The power stream fluid entering nozzle 3 is forced through the restricted orifice thus formed and accelerates so that it enters chamber 13' as a high velocity jet stream having a velocity greater than the aforementioned predetermined velocity.

Walls 21 and 23 may be symmetrically arranged with respect to the axis of orifice 15'. With control fluid applied to nozzle 29 the high velocity power stream is confined to a path of flow along wall 35 and thus does not enter the chamber along the axis of orifice 15'. Instead the power jet is closer to wall 23 than it is to wall 21 at the time it enters the chamber. This bias insures that the power jet locks on to wall 23 at the time it changes from a slowly moving fluid stream to a high velocity jet.

Amplifier 37 has a bistable mode of operation as long as power stream fluid is applied to nozzle 3 and control fluid is applied to nozzle 29. As long as these conditions are maintained the amplifier may be selectively switched from one stable state to the other by control signals applied through nozzles 5 and 7.

A typical cycle of operation of amplifier 37 will now be described. Initially, no control signals are applied so the power stream fluid flows slowly through the chamber and into output channel 11. This condition is defined as the neutral state of the amplifier because the slowly moving power stream cannot be switched by control signals applied to nozzles 5 or 7.

Application of a control signal to nozzle 29 forces the power stream to pass through the restrictive orifice formed by the jet issuing from nozzle 29. The power stream is accelerated and flows along wall 35 so that it enters chamber 13' as a high velocity jet stream. Since the power jet is restricted so that it flows along wall 35 it is closer to wall 23 than wall 21. Therefore, the power jet reduces the pressure in the region adjacent wall 23 and locks on to this wall so that it flows at high velocity into output channel 11. This condition of flow is defined as the reset state of the amplifier and differs from the neutral state in that the power jet may now be switched by applying a control signal to nozzle 7.

A fluid control signal applied to nozzle 7 at this time passes through orifice 19 and into the low pressure region adjacent wall 23. This raises the pressure in this region to the point where the power stream detaches from the wall and swings toward wall 21. The high velocity power jet now entrains fluid particles from the region adjacent wall 21 faster than they can be replaced. The power jet moves into the low pressure region thus created and locks on to wall 21 so that it flows out of the amplifier through channel 9. This condition defines the set state of the amplifier.

Amplifier 37 may be switched from the set state to the reset state by applying a fluid control signal to nozzle 5. The control fluid enters the low pressure region adjacent wall 21 and increases the pressure in this region until the power jet breaks away from wall 21. The power jet then swings over and locks on to wall 23.

Amplifier 37 exhibits a bistable characteristic only as long as a control signal is applied to nozzle 29. If the control signal is terminated the amplifier assumes the neutral state regardless of its condition before termination of the control signal. Thus, the amplifier may also be switched from the set to the reset state by first terminating and subsequently initiating a control signal in nozzle 29.

Figures 3, 4:
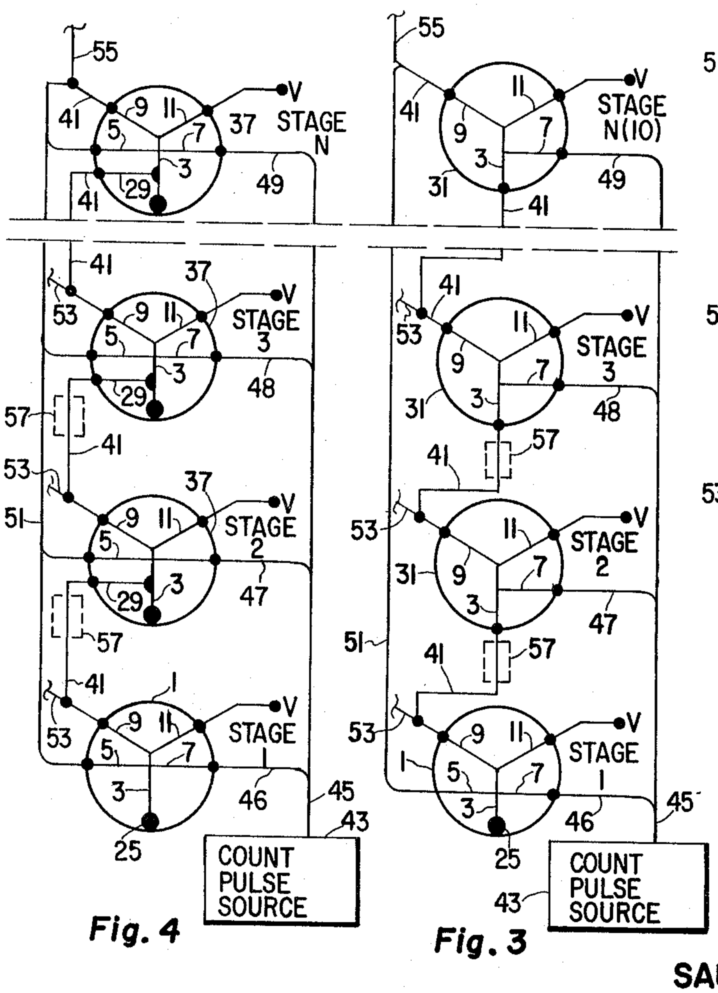
FIGURE 3 shows a first embodiment of a modulo-N counter.

FIGURE 3 schematically illustrates one embodiment of a modulo-N counter, N being any whole number. The counter comprises N serially connected stages each having a single fluid amplifier. Only four stages are shown but additional stages may be added as desired. Stage 1 includes a bistable amplifier 1 and stages 2 through N each include a bistable amplifier 31.

The set output channel 9 of the amplifier in each stage is connected to the power stream input channel 3 of the amplifier in the next stage by means of a tube, pipe, channel or other fluid conveying means 41. The reset output channel 11 of each of the amplifiers may be vented to the atmosphere as indicated by V or may be connected to the return side of the fluid source which continuously supplies fluid to nozzle 3 of the amplifier in stage 1.

A source of count pulses 43 intermittently produces the pulses to be counted and they are applied in parallel over tubes 45 through 49 to the control nozzles 7 of the amplifiers in each stage. Output channel 9 of the amplifier in the last stage is connected by means of tubes 41 and 51 to control nozzle 5 of the amplifier in stage 1 Tubes 53 may be connected to tubes 41 for the purpose of deriving output signals indicative of the count in the counter. Tubes 53 may be connected to pressure transducers of known type to thereby produce signals indicating the count contained in the counter.

Assume that the counter of FIGURE 3 is adapted to operate as a signal denominational order of a multidenominational decimal counter. In this case the counter contains ten stages. Stages 1 through 9 are provided to represent the numerals 1 through 9 and stage 10 is provided as a carry control stage for controlling the carries to the next higher denominational order.

Initially, the power stream applied to the amplifier in stage 1 is flowing through channel 11 and is vented to the atmosphere. If desired, channel 11 may be connected to a pressure transducer (not shown) to provide a positive indication of a zero count in the denominational order. There is no power stream flow in stages 2 through 10 at this time.

The first fluid pulse produced by source 43 is applied substantially simultaneously to the control nozzles 7 of the amplifiers in each stage. Since there is no power stream flow in stages 2 through 10 the fluid pulse has no effect on these stages. However, the pulse enters nozzle 7 of the amplifier in stage 1 and switches this amplifier to its set state. The power stream of the amplifier in stage 1 now flows through output channel 9 of stage 1, passes through connecting tube 41, and enters power nozzle 3 of stage 2. At the same time, a portion of the fluid signal developed in the tube 41 is diverted into tube 53 to provide an indication that stage 1 is in the set condition.

Because of the geometric bias, the power stream entering nozzle 3 of stage 2 assumes a stable path of flow through output channel 11 of this stage and is vented to the atmosphere. This condition is maintained until the second fluid pulse is produced by source 43.

The second pulse enters nozzle 7 of the amplifiers in stages 3 through 10 but has no effect because no power streams are present in these stages. It also enters nozzle 7 of stage 1 but has no effect because the power stream in this stage is already flowing into channel 9. Finally, the second fluid pulse produced by source 43 enters control nozzle 7 of stage 2 and switches the amplifier in this stage to the set state thereby applying fluid to the power nozzle of stage 3.

The geometric bias of the amplifier in stage 3 causes the power stream to assume the reset state so that it flows through channel 11 to the vent. Therefore, after the second count pulse stages 1 and 2 are in the set state, stage 3 is in the reset state and there is no power stream flow in stages 4 through 10. Stated differently, the only flow present in the counter after the second count pulse is from power stream source 25 through nozzle 3 and channel 9 of stage 1, nozzle 3 and channel 9 of stage 2, and nozzle 3 and channel 11 of stage 3 to the vent. This flow produces signals in tubes 53 of stages 1 and 2 which may be used to provide an indication that the counter contains a count of two.

When source 43 produces a third pulse it is applied to nozzle 7 of each stage but switches only stage 3. The power streams of stages 4 through 10 are inactive and the amplifiers of stages 1 and 2 are already set. Only amplifier 3 is reset and active. As a result, the amplifier in stage 3 is switched from the reset to the set state so that its power stream flows out through channel 9 to activate the power stream of stage 4.

From the above description it is obvious that after nine count pulses the amplifiers in stages 1 through 9 are all in the set state with stage 10 being active but reset. Accordingly, it is believed unnecessary to describe in detail the actions of the counter in response to the fourth through ninth input pulses.

Stage 10 controls the reset of the stages in the same denominational order and the application of a carry pulse to stage 1 of the next higher denominational order. These operations occur after every tenth input pulse.

At the time the tenth input pulse occurs all stages except stage 10 are set. Stage 10 is in the reset state with its power stream flowing through channel 11 to the vent. The tenth input pulses passes through nozzle 7 of the tenth stage and switches the power stream of this stage so that it flows through channel 9 to tube 41. The tube 41 is connected to a tube 55 which may in turn be connected to the control nozzle 7 of the first stage in the next higher denominational order. This in effect adds a carry of one into the next order.

The tube 41 is also connected to tube 51 and this tube is in turn connected to control nozzle 5 of the first stage. Therefore, when stage 10 is set an output signal is developed which is fed back to stage 1 as a reset signal. This reset signal switches the power stream of the amplifier in stage 1 so that it flows through channel 11 to the vent.

Since stages 2 through 10 derive their power streams from the fluid flowing out of channel 9 of stage 1, the power streams of these stages terminate when stage 1 is reset. The counter stages are now in the same state as before the first input pulse was received. The cycle of events described above may be carried out repetitively in response to input pulses with each input pulse setting an additional amplifier and every tenth pulse returning all ten amplifiers to their initial conditions.

There are predetermined timing relationships which must exist in order that the counter may function as described above. For example, the maximum time duration for each input pulse must be less than the time which elapses between the instant of application of an input pulse to one stage and the instant the switched power stream enters the interaction chamber of the next stage. Referring to FIGURE 3, there is a definite fixed interval of time between the time an input pulse is applied to nozzle 7 of stage 1 and the time power stream fluid reaches the junction of channels 9 and 11 in stage 2. The duration of each input pulse must be less than this interval or the counter will give an erroneous count greater than the number of input pulses received.

The length and internal configuration of conveying means 41 may be chosen to provide an inherent delay in fluid signals applied thereto. This delay is indicated at 57 in phantom outline and may, for example, include tanks, chambers, or other conventional means for delaying fluid signals. Preferably, delays 57 are substantially equal and delay fluid signals applied thereto for a period of time slightly greater than the duration of an input pulse.

Since there is a predetermined delay between the time a fluid signal is applied to a conveying means 41 and the time it emerges from the conveying means, the reset arrangement provided in FIGURE 3 requires considerable time to complete the reset operation. Stage 10 produces an output signal to reset stage 1 immediately. On the other hand, there is a delay, equal to the delay 57, between the time stage 1 is reset and the time this condition is manifested at stage 2 by termination of power stream flow. In like manner, there is a delay equal to the delay 57 between the time power stream flow stops in stage 2 and the time power stream flow stops in stage 3. The same is true for each of the succeeding stages. Thus, there is a delay equal to nine times the value of one delay 57 before stage 9 is reset. During this extremely long delay the counter produces an inaccurate count indication in tubes 53 since some stages have been reset and others have not.

The modified counter performs the counting function in exactly the same way as the embodiment previously described. It differs only in the manner in which the stages are reset after the counter reaches a full count.

Assume that the counter contains a count of nine. Stages 1 through 9 are all set hence their power streams are flowing out through channels 9 to the power nozzle of the next stage. Stage 10 (not shown) is reset and its power stream is vented to the atmosphere.

A fluid count pulse applied at this time switches the amplifier in stage 10 form the reset to the set state thus producing a signal in tube 51. This signal is applied to nozzle 5 in stages 1 through 10 thus switching the power streams of all amplifiers to the reset state so that they flow through channels 11 to the vents. Immediately after the amplifiers are reset the tubes 53 may be sensed and they provide a correct indication of a zero count in the counter.

Although a correct count indication is produced at tubes 53 the reset operation is not completed until after a time delay equal to one delay 57. When stage 1 is reset a delay equal to delay 57 occurs before the power stream stops flowing in stage 2. In like manner, when stage 2 is reset a delay equal to delay 57 occurs before the power stream stops flowing in stage 3. The same is true for stages 3 and 4, stages 4 and 5 and so forth. However, since all stages are reset simultaneously these delays occur concurrently as opposed to the prior embodiment where the delays occurred serially.

Figure 3A:
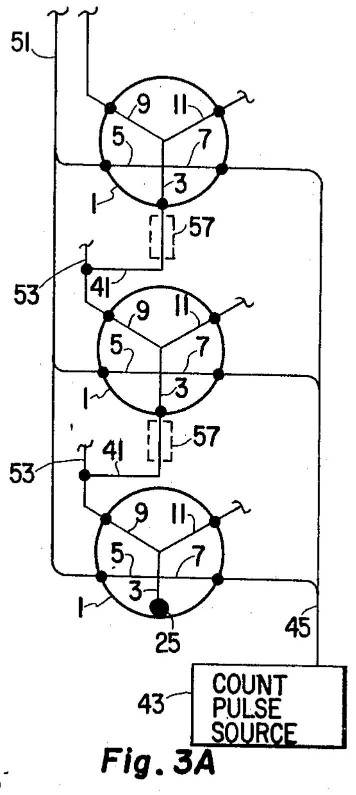
FIGURE 3A shows a counter similar to that shown in FIGURE 3 but having simultaneous reset means; and, FIGURE 4 shows a second embodiment of a modulo-N counter.

It will be noted that counters employing the reset as shown in FIGURE 3 have a reset period increasing as the number of stages is increased. On the other hand, counters employing the reset as shown in FIGURE 3A have a fixed reset period regardless of the number of stages, this reset period being determined primarily by the delay encountered in one delay unit 57.

FIGURE 4 shows a further counter, stages 2 through 10 of this embodiment employing novel fluid amplifiers of the type shown in FIGURE 2. Stage 1 includes an amplifier of the type shown in FIGURE 1. This counter embodiment is similar to the embodiments previously described hence corresponding elements have been assigned like reference numerals.

Output channel 9 of each stage of the counter is connected to control nozzle 29 of the amplifier in the next succeeding stage by fluid conveying means 41. As described above each fluid conveying means includes a signal delay means 57. Output channel 9 of the Nth stage is connected by means of tubes 41 and 51 to the control nozzles 5 in each stage. Count pulse source 43 is connected by means of tubes 45 through 49 to the control nozzles 7 in each stage. Like the embodiments previously described output channels 11 may be vented, and tubes 53 provided for conveying the output signals representing the count in the counter.

A power stream is continuously applied to the power nozzle 3 in each stage. Before the first count pulse is received the following conditions exist. The amplifier in stage 1 is in the reset condition with its high velocity power jet flowing through channel 11. The amplifiers in stages 2 through N are all in their neutral state with their power streams flowing slowly through channels 11.

When the first count pulse is produced it is applied to each of the control nozzles 7. In stages 2 through N the pulse has no appreciable effect since the resulting control jets cannot control the slowly moving power streams. In stage 1 the pulse creates a control jet which switches the power jet of the amplifier to the set state. The power jet flows through channel 9 of stage 1 and is conveyed by tube 41 to control nozzle 29 of stage 2. The power jet fluid passes through nozzle 29 and restricts the flow of power stream fluid in nozzle 3 thus causing the power stream fluid to enter the amplifier chamber as a high velocity power jet. Because of the bias, the amplifier in stage 2 assumes the reset state with its power stream flowing out through channel 11.

The second count pulse has no appreciable effect on the amplifiers in stages 3 through N because these amplifiers are still in the neutral state. It has no effect on the amplifier in stage 1 because this amplifier is already set. The only amplifier affected by the second count pulse is the one in stage 2. The count pulse enters nozzle 7 of this amplifier and switches the power jet from the reset to the set state. The power jet of stage 2 now flows through channel 9 to control nozzle 29 of stage 3 and impinges on the slowly moving power stream in nozzle 3. This causes the amplifier in stage 3 to change from the neutral to the reset state.

The third count pulse switches only stage 3. Stages 1 and 2 are already in the set state and stages 4 through N are in the neutral state and cannot be switched. The third pulse switches the amplifier in stage 3 from the reset to the set state. This amplifier now produces an output signal which is applied to nozzle 29 of stage 4 thus changing that stage to the reset state.

After N–1 input pulses the amplifiers in stages 1 through N–1 are all in the set state. The output from stage N–1 is constraining the power stream of stage N so the latter stage is in the reset state.

The Nth pulse produced by source 43 switches the amplifier in stage N from the reset to the set state. The output signal produced on channel 9 may be conveyed by means of tube 55 to the next order of the counter. Also, the output signal on channel 9 is conveyed through tube 51 to the control nozzle 5 in each stage to thereby reset all of the amplifiers. When the amplifier in stage 1 is reset it stops supplying fluid to control nozzle 29 in stage 2. With no control jet issuing from nozzle 29 the high velocity power jet fluid of this amplifier again becomes a slowly moving power stream flowing through output channel 11 and the amplifier assumes the neutral state.

Since stages 2 through N are reset concurrently with stage 1 it is seen that each stage simultaneously stops supplying control fluid to nozzle 29 of the succeeding stage. Consequently, stages 3 through N switch from the reset state to the neutral state at the same time as stage 2. As soon as stages 2 through N have all been returned to the neutral state the counter is ready to receive the next count pulse.

The above discussion describes the counting sequence of the various counter embodiments and also the manner in which the counters are reset upon reaching a full count. In some applications it may be desirable to reset the counter to a zero count before the counter reaches a full count. In each embodiment, this reset may be accomplished by providing an additional control nozzle in each counter stage, this control nozzle may be similar in function to the control nozzle 5 but connected to a source which produces a fluid pulse each time the counter is to be reset to zero.

While the basic principles of the invention have been described in connection with various exemplary embodiments, other embodiments falling within the spirit and scope of the invention will be obvious. For example the novel amplifier control method may be applied to amplifiers of the type shown in FIGURE 2 but having dividing element 27 positioned on the axis of nozzle 3 so that in the absence of any control signals the power stream divides and flows equally into channels 9 and 11. Also, the novel method of power stream control disclosed herein is equally suitable for use with vortex amplifiers, induction amplifiers, and so-called three-dimensional amplifiers. With respect to the counter embodiments, the counter of FIGURE 4 may be provided with a reset circuit similar to that shown in FIGURE 3 in which case stages 2 through N are never switched from the set to the reset state directly but are switched from the set to the neutral state before being reset. It is intended therefore to be limited only by the scope of the appended claims.

The embodiments of the invention in which an exclusive property or privilege is claimed are defined as follows:

1. A modulo-N counter for counting fluid pulses, said counter comprising a series of fluid amplifiers each having an interaction chamber, at least one output channel, and at least one control nozzle for emitting control fluid for deflecting a power jet injected into said chamber into said output channel; means including a plurality of signal delay means for delaying fluid signals applied thereto for a predetermined interval of time, each said means being responsive to power jet flow in said one output channel of one amplifier of said series for injecting a power jet into the interaction chamber of the next amplifier in said series; means for periodically producing fluid pulses each occurring for an interval of time less than said predetermined interval, said means producing said fluid pulses at intervals of time greater than said predetermined interval; and means for simultaneously applying each of said fluid pulses to said control nozzles of each of said amplifiers.

2. A modulo-N counter as claimed in claim 1 and further comprising means for continuously injecting a power jet into the chamber of the first amplifier in said series.

3. A modulo-N counter as claimed in claim 2 and further comprising means responsive to power jet flow in said output channel of the last amplifier in said series for terminating power jet flow into said output channel in all of said amplifiers.

4. A modulo-N counter as claimed in claim 1 wherein each of said means for injecting a power jet comprises a power jet nozzle terminating at an orifice in the corresponding chamber, and means connecting said power jet nozzle to said output channel of the preceding amplifier in said series whereby power jet flow in any amplifier of said series occurs only when there is power jet flow into said output channel in each of the preceding amplifiers of said series.

5. A modulo-N counter for counting fluid pulses, said counter comprising: a series of bistable fluid amplifiers each having a set state and a reset state manifested by power jet flow into a set or a reset output channel, power nozzle means for injecting a power jet, each of said amplifiers being biased whereby it assumes the reset state upon initiation of its power jet, and control nozzle means for switching the amplifier from the reset to the set state; fluid conveying means connecting the set output channel of each amplifier to the power nozzle means of the next succeeding amplifier in said series, each of said fluid conveying means including delay means for delaying fluid signals applied thereto for at least as long as the duration of one of said fluid pulses; means for continuously applying fluid to the power nozzle means of said first amplifier; and means for simultaneously applying fluid count pulses to the control nozzle means of each of said amplifiers whereby one amplifier is set and the next succeeding amplifier assumes the reset state in response to each count pulse.

6. A fluid amplifier having an internal chamber configuration whereby an injected power stream of predetermined velocity creates forces within said chamber to hold said power stream in a first or a second stable path of flow, power nozzle means for normally injecting a power stream into said chamber at less than said predetermined velocity, said power nozzle means including a velocity control nozzle located in the region where the power stream is injected into said chamber, said velocity control nozzle being directed at substantially right angles to the power stream and being responsive to a fluid control signal applied thereto for restricting the effective orifice size of the power nozzle means and thereby for accelerating said power stream to a velocity greater than said predetermined velocity whereby said power stream assumes one of said stable paths of flow.

7. A fluid amplifier as claimed in claim 6, said amplifier further including first and second outputs for receiving said power stream when it flows in said first and second stable paths of flow, respectively, and a further control nozzle terminating at an orifice in said chamber for selectively switching said power stream from said first to said second stable path of flow in response to further fluid control signals.

8. An amplifier as claimed in claim 7 in combination with means for continuously supplying power fluid to said power nozzle means, means for selectively applying fluid control signals to said velocity control nozzle; and means for selectively applying further fluid control signals to said further control nozzle.

References Cited by the Examiner

UNITED STATES PATENTS

| | | | |
|---|---|---|---|
| 2,265,737 | 12/1941 | McMahan. | |
| 3,001,698 | 9/1961 | Warren | 235—201 |
| 3,030,979 | 4/1962 | Reilly | 137—624.14 |
| 3,075,548 | 1/1963 | Horton | 235—201 |
| 3,093,306 | 6/1963 | Warren | 235—201 |
| 3,114,390 | 12/1963 | Glattli | 235—201 X |
| 3,117,593 | 1/1964 | Sowers. | |
| 3,122,165 | 2/1964 | Horton | 235—201 X |
| 3,128,039 | 4/1964 | Norwood | 235—201 |
| 3,191,611 | 6/1965 | Bauer | 235—201 |

OTHER REFERENCES

Proceeding of the Fluid Amplification Symposium, Diamond Ordnance Fuze Laboratories, vol. 1, pp. 114 and 145, October 1962.

O. L. Wood and H. L. Fox, "Fluid Computer," International Science and Technology. No. 23, pp. 44–52, November 1963, rec'd Scientific Library Oct. 28, 1963.

RICHARD B. WILKINSON, *Primary Examiner.*

LEO SMILOW, *Examiner.*

W. F. BAUER, L. R. FRANKLIN, *Assistant Examiners.*